United States Patent [19]
Chen et al.

[11] Patent Number: 5,671,238
[45] Date of Patent: Sep. 23, 1997

[54] METHOD AND CIRCUITRY FOR GENERATING R-BIT PARALLEL CRC CODE FOR AN L-BIT DATA SOURCE

[75] Inventors: Kim-Joan Chen, Chia-Yi Hsien; Ching-Long Chang, Yun-Lin Hsien, both of Taiwan

[73] Assignee: National Science Council of R.O.C., Taipei, Taiwan

[21] Appl. No.: 550,574

[22] Filed: Oct. 31, 1995

[51] Int. Cl.$^6$ .................................................. H03M 13/00
[52] U.S. Cl. .......................................................... 371/37.6
[58] Field of Search ............................................. 321/37.6

[56] References Cited

PUBLICATIONS

Hsiao et al., "Serial–to–Parallel Transformation of Linear–Feedback Shift–Register Circuits", IEEE Transactions on Electronic Computers, Dec. 1964, pp. 738–740.
Boudreau et al., "Parallel CRC Generation for Multilength Characters", IBM Technical Disclosure Bulletin, vol. 15, No. 4, Sep. 1972, pp. 1314–1315 Sep. 1972.

*Primary Examiner*—Stephen M. Baker
*Attorney, Agent, or Firm*—Morgan & Finnegan, L.L.P.

[57] ABSTRACT

A method for generating r-bit parallel CRC code for a data source grouped into at least one successive p-bit parallel data group and a q-bit parallel data group is disclosed. The number q is less than the number p. The method includes the steps of: providing a data processing unit which has an output side and an input side that is adapted to receive successively the p-bit and q-bit parallel data groups, the processing unit reflecting one of the p-bit parallel data groups at the input side to the output side when the p-bit parallel data group is present at the input side, the processing unit adding a bit string to the q-bit parallel data group such that sum of the number q and number of bits in the bit string is equal to the number p, the processing unit presenting the q-bit parallel data group and the bit string at the output side when the q-bit parallel data group is present at the input side; providing a binary output generating unit which operates in response to data at the output side to produce an r-bit parallel initial CRC code according to a predefined generating polynomial function; and providing a code correcting unit which receives the r-bit parallel initial CRC code from the generating unit and which operates in response to the parallel initial CRC code to produce an r-bit parallel final CRC code according to a predefined code correcting function.

11 Claims, 6 Drawing Sheets

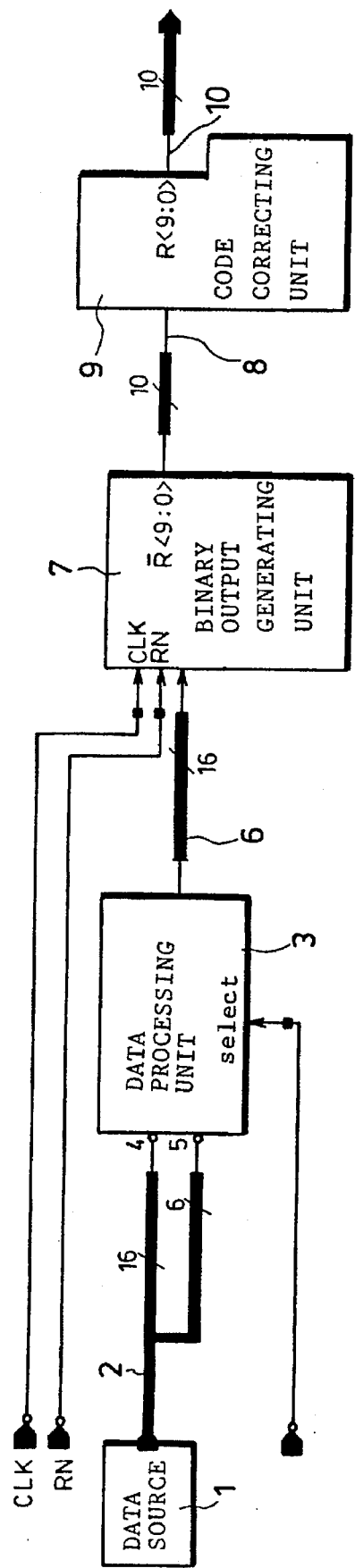
F I G. 1

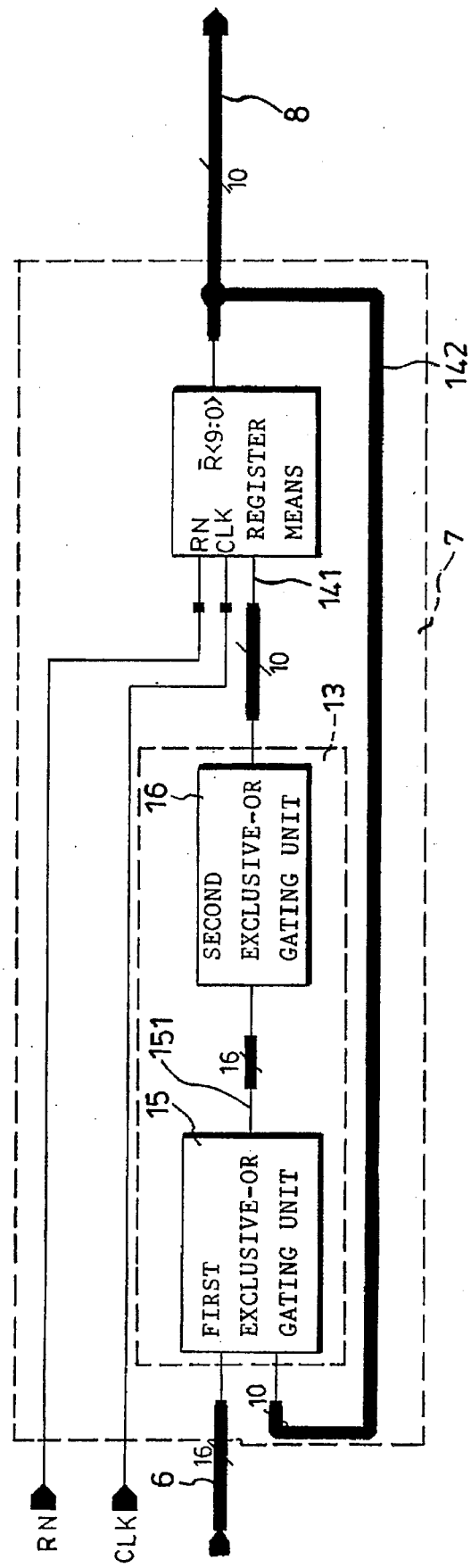
F I G. 3

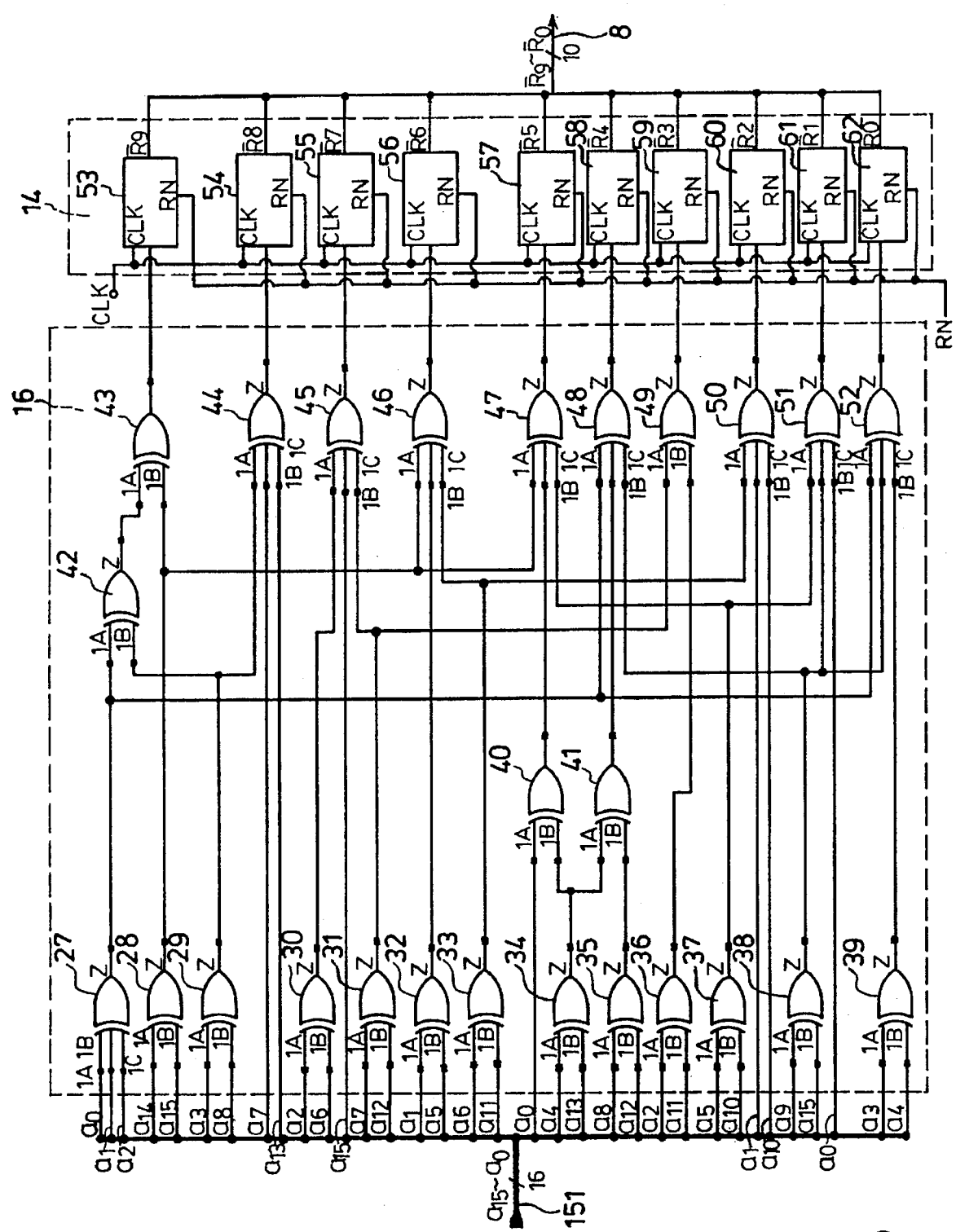
F I G. 5

5,671,238

METHOD AND CIRCUITRY FOR GENERATING R-BIT PARALLEL CRC CODE FOR AN L-BIT DATA SOURCE

BACKGROUND OF THE INVENTION

1. Field of the Invention

This invention relates to a method and circuitry for generating r-bit parallel CRC code for an L-bit data source which is grouped into successive at least one p-bit data group and a q-bit parallel data group, wherein the number q is less than the number p.

2. Description of the Related Art

Conventionally, a parallel cyclic redundancy check (CRC) generating circuitry usually operates to calculate a parallel CRC code with the use of a look-up table which is generated in accordance with a predefined generating polynomial function and which is stored in a memory device. However, the look-up table occupies a large amount of memory space, thereby increasing the implementation cost. Furthermore, latency is encountered since the data which is input for calculation during each clock pulse must be compared with the data of the look-up table.

U.S. Pat. No. 5,103,451 discloses a parallel CRC circuit that avoids the use of a look-up table, thereby obviating the need for a large amount of memory space. However, data from the data source must have a total length that is a multiple of a number K equal to the length of data which is output from the data source during each clock pulse for calculation. This limitation will greatly limit the application of the parallel CRC circuit.

SUMMARY OF THE INVENTION

Therefore, the main objective of the present invention is to provide a method and circuitry for generating r-bit parallel CRC code for an L-bit data source, which method and circuitry can overcome the drawbacks that are associated with the aforementioned prior art.

According to one aspect of the present invention, a method for generating r-bit parallel CRC code for an L-bit data source is disclosed. The L-bit data source is grouped into successive at least one p-bit parallel data group and a q-bit parallel data group. The number q is less than the number p. The method includes the steps of: providing a data processing unit which has an output side and an input side that is adapted to be connected electrically to the data source and that is adapted to receive successively the p-bit parallel data groups and the q-bit parallel data group, the data processing unit reflecting one of the p-bit parallel data groups at the input side to the output side when the p-bit parallel data group is present at the input side, the data processing unit adding a bit string to the q-bit parallel data group such that the sum of the number q and the number of bits in the bit string is equal to the number p, the data processing unit presenting the q-bit parallel data group and the bit string at the output side thereof when the q-bit parallel data group is present at the input side; providing a binary output generating unit which is connected electrically to the output side of the data processing unit and which operates in response to data at the output side of the data processing unit to produce an r-bit parallel initial CRC code according to a predefined generating polynomial function; and providing a code correcting unit which is connected electrically to the binary output generating unit and which receives the r-bit parallel initial CRC code therefrom, the code correcting unit operating in response to the r-bit parallel initial CRC code to produce an r-bit parallel final CRC code according to a predefined code correcting function.

According to another aspect of the present invention, a universal parallel CRC generating circuitry for generating an r-bit parallel CRC code for an L-bit data source is disclosed. The L-bit data source is grouped into successive at least one p-bit parallel data group and a q-bit parallel data group. The number q is less than the number p. The parallel CRC generating circuitry includes a data processing unit, a binary output generating unit and a code correcting unit. The data processing unit has an output side and an input side which is adapted to be connected electrically to the data source and which is adapted to receive successively the p-bit parallel data group and the q-bit parallel data group. The data processing unit reflects the p-bit parallel data group at the input side to the output side when the the p-bit parallel data group is present at the input side. The data processing unit adds a bit string to the q-bit parallel data group such that the sum of the number q and the number of bits in the bit string is equal to the number p. The data processing unit presents the q-bit parallel data group and the bit string at the output side thereof when the q-bit parallel data group is present at the input side. The binary output generating unit is connected electrically to the output side of the data processing unit and operates in response to data at the output side of the data processing unit to produce an r-bit parallel initial CRC code according to a predefined generating polynomial function. The code correcting unit is connected electrically to the binary output generating unit and receives the r-bit parallel initial CRC code therefrom. The code correcting unit operates in response to the r-bit parallel initial CRC code to produce an r-bit parallel final CRC code according to a predefined code correcting function.

BRIEF DESCRIPTION OF THE DRAWINGS

Other features and advantages of the present invention will become apparent in the following detailed description of the preferred embodiment, with reference to the accompanying drawings, of which:

FIG. 1 is a schematic block diagram showing a universal parallel CRC generating circuitry for generating an r-bit parallel CRC code for an L-bit data source in accordance with the present invention;

FIG. 3 is a schematic block diagram showing a binary output generating unit of the parallel CRC generating circuitry according to the present invention;

FIG. 5 is a schematic circuit diagram showing the relationship between a second exclusive-OR gating unit and a register means of the binary output generating unit shown in FIG. 3.

DETAILED DESCRIPTION OF THE PREFERRED EMBODIMENT

Referring to FIG. 1, a universal parallel cyclic redundancy check (CRC) generating circuitry according to the present invention includes a data processing unit 3, a binary output generating unit 7 and a code correcting unit 9. The parallel CRC generating circuitry of the present invention is useful for generating an r-bit parallel CRC code for an L-bit data source 1 which is grouped into successive at least one p-bit parallel data group and a q-bit parallel data group. The number q is less than the number p. In the present embodiment, the number L is selected to be 374, the number r is selected to be 10, the number p is selected to be 16 such that the data source 1 is grouped into twenty-three successive 16-bit parallel data groups and a final 6-bit parallel data group.

Figure 2:
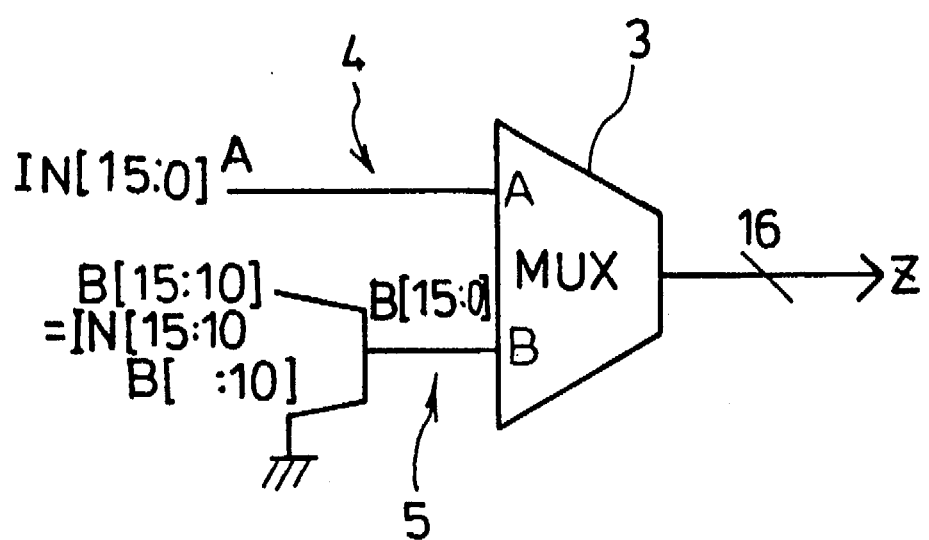
FIG. 2 is a schematic block diagram showing a data processing unit of the parallel CRC generating circuitry according to the present invention.

In the present embodiment, the data processing unit 3 is a multiplexer unit which has an output side and an input side, as shown in FIG. 2. The input side of the data processing unit 3 has a first input set 4 adapted to receive the 16-bit parallel data groups (A[15:0]) from the data source 1 via a 16-bit data bus 2 and a second input set 5 adapted to receive the 6-bit parallel data group (B[15:10]) from the data source 1. A finite state machine (not shown) is connected to a select terminal of the data processing unit 3 to control operation of the latter. The data processing unit 3 reflects data at the first input set 4 to the output side thereof when one of the 16-bit parallel data groups (A[15:0]) is present at the first input set 4. In the present embodiment, the data processing unit 3 adds a 10-bit bit string of ten bits to the 6-bit parallel data group (B[15:10]) and presents the 6-bit parallel data group (B[15:10]) and the bit string (B[9:0]) at the output side when the 6-bit parallel data group (B[15:10]) is present at the second input set 5. Thus, the data processing unit 3 always has a 16-bit output at the output side thereof even though only the 6-bit parallel data group (B[15:10]) is present at the input side. In the present embodiment, the bit string (B[9:10]) is a low logic bit string.

Referring to FIGS. 1 and 3, the binary output generating unit 7 includes an exclusive-OR gating means 13 and a register means 14. The exclusive-OR gating means 13 includes a first exclusive-OR gating unit 15 and a second exclusive-OR gating unit 16. The first exclusive-OR gating unit 15 has a first input side connected electrically to the output side of the data processing unit 3 via a 16-bit data bus 6, and a second input side. The second exclusive-OR gating unit 16 has an input side connected electrically to an output side of the first exclusive-OR gating unit 15 via a 16-bit data bus 151. The register means 14 has an input side connected electrically to an output side of the second exclusive-OR gating unit 16 via a 10-bit data bus 141 and an output side connected electrically to the input side of the first exclusive-OR gating unit 15 via a 10-bit data bus 142. The register means 14 further has an output side connected electrically to the code correcting unit 9 via a 10-bit data bus 8.

Figure 4:
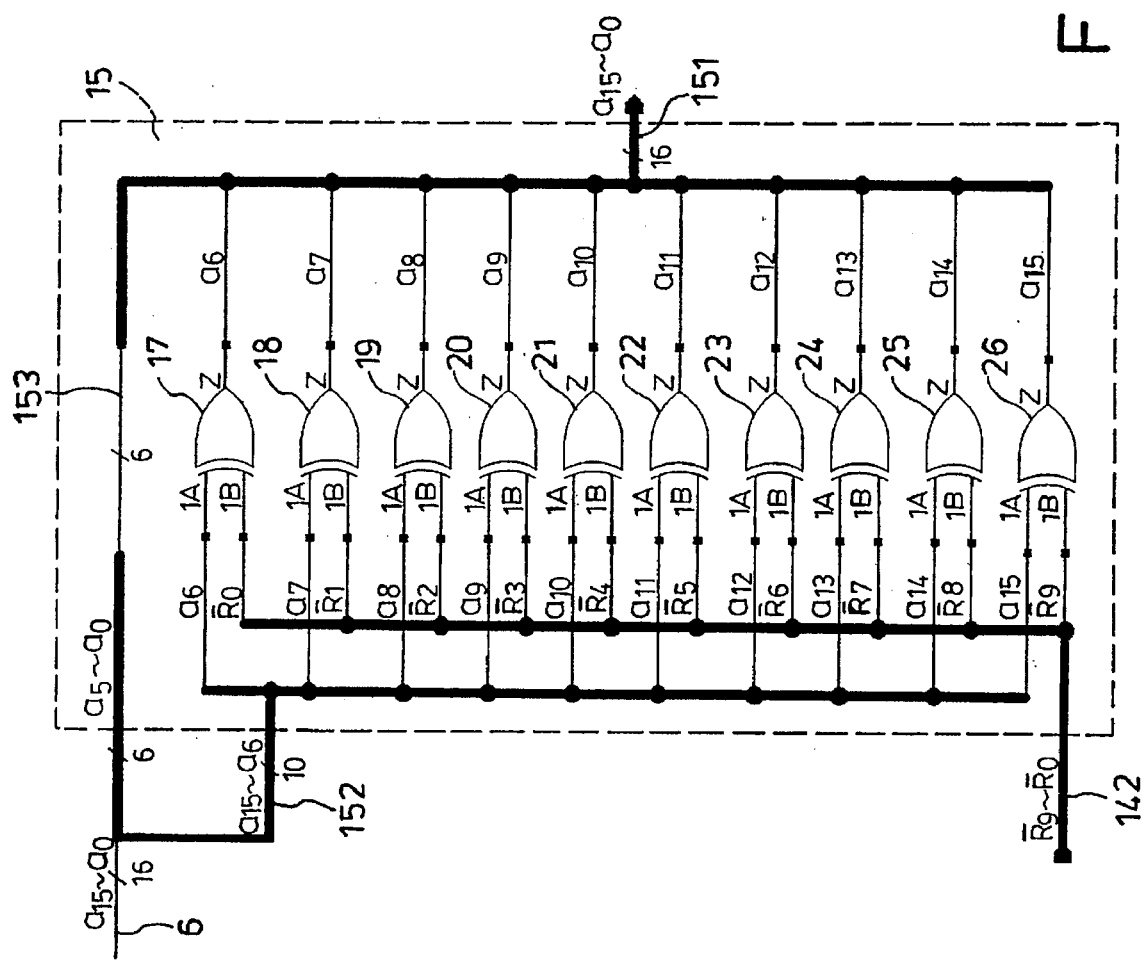
FIG. 4 is a schematic circuit diagram of a first exclusive-OR gating unit of the binary output generating unit shown in FIG. 3.

As best shown in FIG. 4, the first exclusive-OR gating unit 15 includes a plurality of exclusive-OR gates. In the present embodiment, the first exclusive-OR gating unit 15 includes ten exclusive-OR gates, 17 to 26. Each of the exclusive-OR gates, 17 to 26, has a first input terminal connected electrically to the data bus 6 so as to receive a respective one of ten bits (a6 to a15) at the datat bus 6 via a 10-bit data bus 152, a second input terminal connected electrically to the output side of the register means 14 via the 10-bit data bus 142, and an output terminal connected electrically to the data bus 151. The remaining six bits (a0 to a5) at the data bus 6 are transferred to the data bus 151 via a 6-bit data bus 153.

As best illustrated in FIG. 5, the second exclusive-OR gating unit 16 includes a plurality of first, second and third exclusive-OR gates. In the present embodiment, the second exclusive-OR gating unit 16 includes thirteen first exclusive-OR gates, 27 to 39, three second exclusive-OR gates, 40 to 42, and ten third exclusive-OR gates, 43 to 52. The first exclusive-OR gates, 27 to 39, have input terminals connected electrically to the output side of the first exclusive-OR gating unit 15 via the 16-bit data bus 151. The second exclusive-OR gates, 40 to 52, have input terminals connected electrically to the output side of the first exclusive-OR gating unit 15 and to corresponding output terminals of the first exclusive-OR gates, 27 to 39. The third exclusive-OR gates, 43 to 52, have input terminals connected electrically to the output side of the first exclusive-OR gating unit 15, to the corresponding output terminals of the first exclusive-OR gates, 27 to 39, and to corresponding output terminals of the second exclusive-OR gates, 40 to 42.

The register means 14 includes a plurality of flip-flop units. In the present embodiment, the register means 14 includes ten flip-flop units, 53 to 62. Each of the flip-flop units, 53 to 62, has an input terminal connected electrically to an output terminal of a respective one of the third exclusive-OR gates, 43 to 52, and an output terminal connected electrically to the input side of the code correcting unit 9 via the 10-bit data bus 8.

Figure 6:
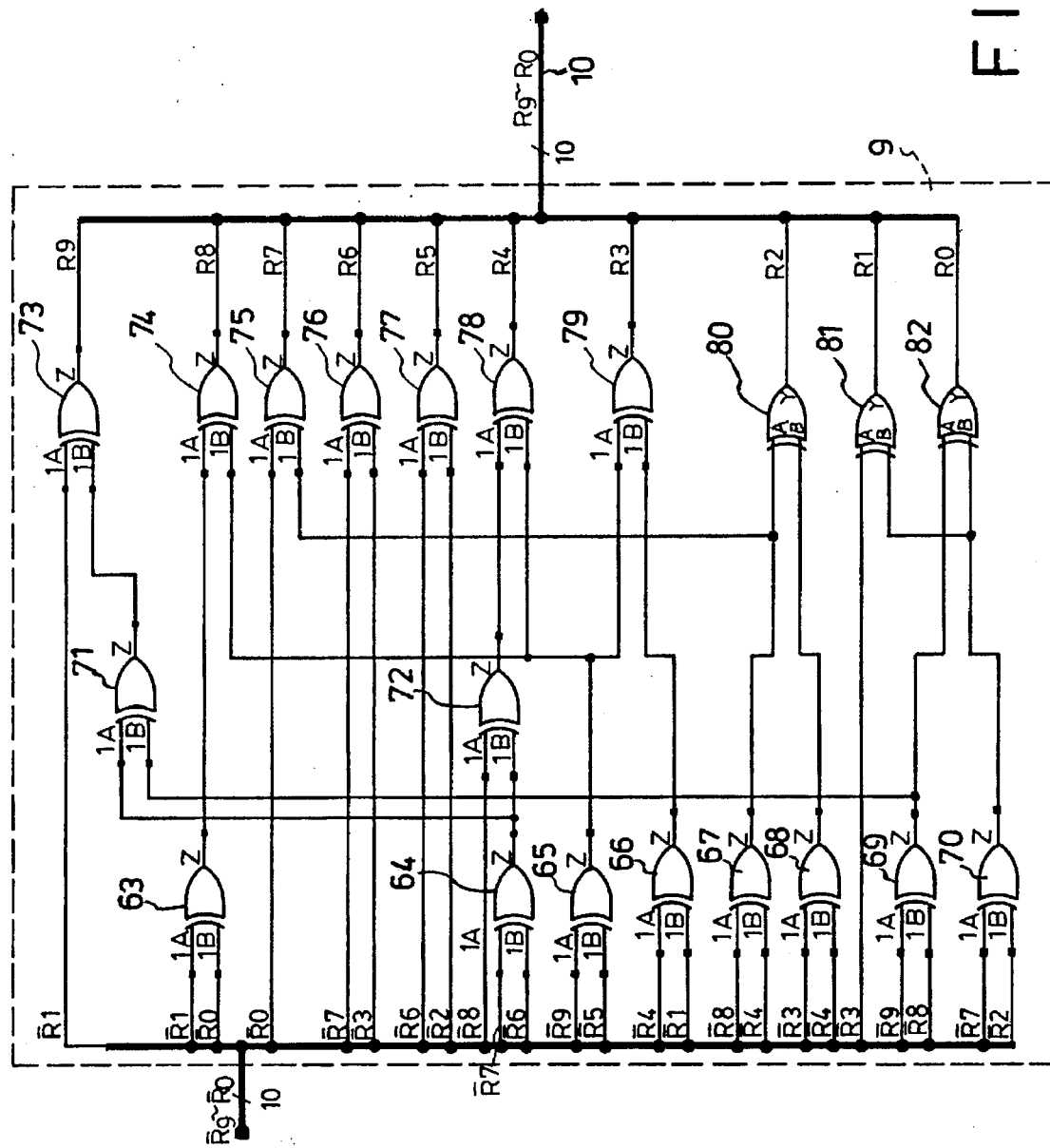
FIG. 6 is a schematic circuit diagram of a code correcting unit of the parallel CRC generating circuitry according to the present invention.

Referring now to FIG. 6, the code correcting unit 9 includes exclusive-OR gating means which consists of a plurality of first exclusive-OR gates, a plurality of second exclusive-OR gates, and a plurality of third exclusive-OR gates. In the present embodiment, the exclusive-OR gating means of the code correcting unit 9 includes eight first exclusive-OR gates, 63 to 70, two second exclusive-OR gates, 71 and 72, and ten third exclusive-OR gates, 73 to 82. The first exclusive-OR gates, 63 to 70, have input terminals connected electrically to the output side of the register means 14 via the data bus 8. The second exclusive-OR gates 71,72 have input terminals connected to the output side of the register means 14 and to corresponding output terminals of the first exclusive-OR gates, 63 to 70. The third exclusive-OR gates, 73 to 82, have input terminals connected electrically to the output side of the register means 14, to the corresponding output terminals of the first exclusive-OR gates, 63 to 70, and to corresponding output terminals of the second exclusive-OR gates 71,72. Each of the third exclusive-OR gates 73 to 82 has an output terminal connected electrically to a 10-bit output data bus 10.

Referring again to FIGS. 1 to 3, for parallel CRC code generation, since the number L is supposed to be 374, there are successive twenty-three 16-bit parallel data groups and one 6-bit parallel data group to be transferred successively from the data source 1 to the data processing unit 3. A first one of the twenty-three 16-bit parallel data groups is transferred to the data processing unit 3 during a first clock pulse. The data processing unit 3 reflects the first one of the 16-bit parallel data groups at the first input set 4 of the input side to the output side, and the binary output generating unit 7 operates in response to data at the output side of the data processing unit 3 to produce a 10-bit parallel initial CRC code corresponding to the first one of the 16-bit parallel data groups according to a predefined generating polynomial function. In the present embodiment, the predefined generating polynomial function is $$G(X)=G_r X^r + G_{r-1} X^{r-1} + \ldots + G_1 X + G_0$$

where "+" is an exclusive-OR operation. Upon arrival of the next clock pulse, the initial CRC code corresponding to the first one of the 16-bit parallel data groups is output at the 10-bit data bus 8 while the next 16-bit parallel data group to undergo CRC calculation is transferred from the data source 1 to the data processing unit 3. It should be noted that the output at the data bus 8 is fed back to the binary output generating unit 7 for the calculation of the next 16-bit parallel data group. After the twenty-three 16-bit parallel data groups have been processed successively in the aforementioned manner, the 6-bit parallel data group is transferred from the data source 1 to the data processing unit 3 via the second input set 5 of the input side of the data processing unit 3. At this time, the data processing unit 3 adds a bit string, which is a low logic bit string having a length of 10 bits, to the 6-bit parallel data group such that the total length of the 6-bit parallel data group and the 10-bit bit string is equal to 16 bits. The data processing unit 3 presents the 6-bit parallel data group and the bit string at the output side thereof. Then, the binary output generating unit 7 operates in response to data at the output side of the data processing unit 3 to produce a 10-bit parallel initial CRC code according to the predefined generating polynomial function. The resulting initial CRC code is stored in the register means 14 and is transferred to the code correcting unit 9 upon arrival of the next clock pulse. The code correcting unit 9 receives the 10-bit parallel initial CRC code associated with the 6-bit parallel data group from the binary output generating unit 7 and operates in response to the same to produce a 10-bit final CRC code according to a predefined code correcting function. In the present embodiment, the predefined code correcting function is $$F(X)=F_rX^r+F_{r-1}X^{r-1}+\ldots+F_1X+F_0$$

where "+" is an exclusive-OR operation.

It should be noted that the method for creating the binary output generating unit 7 and the code correcting unit 9 is similar to that described in the aforementioned U.S. Pat. No. 5,103,451 and thus, the detailed descriptions thereof will be omitted herein.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

We claim:

1. A method for generating r-bit parallel CRC code for an L-bit data source, the L-bit data source being grouped into successive at least one p-bit parallel data group and a q-bit parallel data group, the number q being less than the number p, said method comprising the steps of:

providing a data processing unit which has an output side and an input side that is adapted to be connected electrically to said data source and that is adapted to receive successively said p-bit parallel data group and said q-bit parallel data group, said data processing unit reflecting one of said p-bit parallel data groups at said input side to said output side when said one of said p-bit parallel data groups is present at said input side, said data processing unit adding a bit string to said q-bit parallel data group such that sum of the number q and number of bits in said bit string is equal to the number p, said data processing unit presenting said q-bit parallel data group and said bit string at said output side when said q-bit parallel data group is present at said input side;

providing a binary output generating unit which is connected electrically to said output side of said data processing unit and which operates in response to data at said output side of said data processing unit to produce an r-bit parallel initial CRC code according to a predefined generating polynomial function; and providing a code correcting unit which is connected electrically to said binary output generating unit and which receives said r-bit parallel initial CRC code therefrom, said code correcting unit operating in response to said r-bit parallel initial CRC code to produce an r-bit parallel final CRC code according to a predefined code correcting function.

2. A method as claimed in claim 1, wherein said bit string is a low logic bit string.

3. A method as claimed in claim 1, wherein said predefined generating polynomial function is $$G(X)=G_rX^r+G_{r-1}X^{r-1}+\ldots+G_1X+G_0$$

where "+" is an exclusive-OR operation.

4. A method as claimed in claim 1, wherein said predefined code correcting function is $$F(X)=F_rX^r+F_{r-1}X^{r-1}+\ldots+F_1X+F_0$$

where "+" is an exclusive-OR operation.

5. A universal parallel CRC generating circuitry for generating an r-bit parallel CRC code for an L-bit data source, the L-bit data source being grouped into successive at least one p-bit parallel data group and a q-bit parallel data group, the number q being less than the number p, said parallel CRC generating circuitry comprising:

a data processing unit having an output side and an input side which is adapted to be connected electrically to said data source and which is adapted to receive successively said p-bit parallel data group and said q-bit parallel data group, said data processing unit reflecting one of said p-bit parallel data groups at said input side to said output side when said one of said p-bit parallel data groups is present at said input side, said data processing unit adding a bit string to said q-bit parallel data group such that sum of the number q and number of bits in said bit string is equal to the number p, said data processing unit presenting said q-bit parallel data group and said bit string at said output side when said q-bit parallel data group is present at said input side;

a binary output generating unit connected electrically to said output side of said data processing unit and operating in response to data at said output side of said data processing unit to produce an r-bit parallel initial CRC code according to a predefined generating polynomial function; and a code correcting unit connected electrically to said binary output generating unit and receiving said r-bit parallel initial CRC code therefrom, said code correcting unit operating in response to said r-bit parallel initial CRC code to produce an r-bit parallel final CRC code according to a predefined code correcting function.

6. A universal parallel CRC generating circuitry as claimed in claim 5, wherein said bit string is a low logic bit string.

7. A universal parallel CRC generating circuitry as claimed in claim 5, wherein said input side of said data processing unit has a first input set adapted to receive said p-bit parallel data group and a second input set adapted to receive said q-bit parallel data group.

8. A universal parallel CRC generating circuitry as claimed in claim 5, wherein said predefined generating polynomial function is $$G(X)=G_rX^r+G_{r-1}X^{r-1}+\ldots+G_1X+G_0$$

where "+" is an exclusive-OR operation.

9. An universal parallel CRC generating circuitry as claimed in claim 5, wherein said code correcting function is $$F(X)=F_rX^r+F_{r-1}X^{r-1}+\ldots+F_1X+F_0$$

where "+" is an exclusive-OR operation.

10. A universal parallel CRC generating circuitry as claimed in claim 9, wherein said code correcting unit includes exclusive-OR gating means connected electrically to said binary output generating unit, said exclusive-OR gating means receiving said r-bit parallel initial CRC code and operating in response to said r-bit parallel initial CRC code to produce said r-bit parallel final CRC code in accordance with the predefined code correcting function.

11. An universal parallel CRC generating circuitry as claimed in claim 10, wherein said exclusive-OR gating means includes a plurality of first exclusive-OR gates connected electrically to said binary output generating unit, a plurality of second exclusive-OR gates connected electrically to said binary output generating unit and to said plurality of first exclusive-OR gates, and a plurality of third exclusive-OR gates connected electrically to said binary output generating unit, to said plurality of first exclusive-OR gates and to said plurality of second exclusive-OR gates.

\* \* \* \* \*